(12) United States Patent
Freitas et al.

(10) Patent No.: US 11,727,730 B2
(45) Date of Patent: *Aug. 15, 2023

(54) SYSTEMS AND METHODS FOR GENERATING AND PROVIDING TIMELY VEHICLE EVENT INFORMATION

(71) Applicant: SmartDrive Systems, Inc., Westlake, TX (US)

(72) Inventors: Mark Freitas, San Diego, CA (US); Jason Palmer, Carlsbad, CA (US); Reza Ghanbari, San Diego, CA (US); Nicholas Shayne Brookins, Encinitas, CA (US); Slaven Sljivar, San Diego, CA (US); Barry James Parshall, Portland, OR (US); Daniel Andrew Deninger, Carlsbad, CA (US)

(73) Assignee: SmartDrive Systems, Inc., Westlake, CA (US)

( * ) Notice: Subject to any disclaimer, the term of this patent is extended or adjusted under 35 U.S.C. 154(b) by 322 days.

This patent is subject to a terminal disclaimer.

(21) Appl. No.: 17/079,775

(22) Filed: Oct. 26, 2020

(65) Prior Publication Data

US 2021/0056775 A1  Feb. 25, 2021

Related U.S. Application Data

(63) Continuation of application No. 16/025,813, filed on Jul. 2, 2018, now Pat. No. 10,818,102.

(51) Int. Cl.
*G07C 5/00* (2006.01)
*G07C 5/08* (2006.01)
(Continued)

(52) U.S. Cl.
CPC ......... *G07C 5/008* (2013.01); *G06F 16/2462* (2019.01); *G06F 16/29* (2019.01);
(Continued)

(58) Field of Classification Search
CPC .......... G07C 5/008; G07C 5/02; G07C 5/085; G07C 5/0841; G06F 16/2462; G06F 16/29; G06F 16/9537; G06F 30/20
See application file for complete search history.

(56) References Cited

U.S. PATENT DOCUMENTS 6,888,622 B2   5/2005   Shimomura
8,297,977 B2   10/2012  Freund
(Continued)

FOREIGN PATENT DOCUMENTS

WO   2017195120   11/2017

OTHER PUBLICATIONS

Best Andrew et al: "AutonoVi: Autonomous vehicle planning with dynamic maneuvers and traffic constraints", 2017 IEEE/RSJ International Conference On Intelligent Robots and Systems (IROS), IEEE, Sep. 24, 2017 (Sep. 24, 2017), pp. 2629-2636, XP033266238, DOI: 10.1109/IROS.2017.8206087 [retrieved on Dec. 13, 2017] * p. 2629 * p. 2631-p. 2635.

*Primary Examiner* — Donald J Wallace
(74) *Attorney, Agent, or Firm* — Esplin & Associates, PC

(57) ABSTRACT

This disclosure relates to a system configured to generate and provide timely vehicle event information for a fleet of vehicles including at least a first vehicle. Individual vehicles detect vehicle events and transmit related information to a remote computing server. The remote computing server determines whether the detected vehicles events are relevant to add to a set of vehicle events scenarios. For example, if a particular vehicle event is duplicative of a previous vehicle event, if may not need to be added. The newest vehicles events may be reported at certain intervals, in particular if they are indicative of a trend.

15 Claims, 5 Drawing Sheets

(51) Int. Cl.
  *G07C 5/02*     (2006.01)
  *G06F 16/29*    (2019.01)
  *G06F 16/2458*  (2019.01)
  *G06F 16/9537*  (2019.01)
  *G06F 30/20*    (2020.01)

(52) U.S. Cl.
  CPC .......... *G06F 16/9537* (2019.01); *G06F 30/20* (2020.01); *G07C 5/02* (2013.01); *G07C 5/085* (2013.01)

(56) References Cited

U.S. PATENT DOCUMENTS

| | | |
|---|---|---|
| 8,626,565 B2 | 1/2014 | Petroff |
| 9,141,109 B1 | 9/2015 | Kamata |
| 9,147,353 B1 | 9/2015 | Slusar |
| 9,594,371 B1 | 3/2017 | Palmer |
| 10,083,551 B1 | 9/2018 | Schmitt |
| 10,818,102 B1 | 10/2020 | Freitas |
| 2007/0048690 A1 | 3/2007 | Stricek |
| 2007/0132773 A1 | 6/2007 | Plante |
| 2007/0241882 A1 | 10/2007 | Panttaja |
| 2008/0111666 A1 | 5/2008 | Plante |
| 2008/0215202 A1 | 9/2008 | Breed |
| 2010/0191411 A1 | 7/2010 | Cook |
| 2012/0256770 A1 | 10/2012 | Mitchell |
| 2013/0289873 A1 | 10/2013 | Mitchell |
| 2014/0094992 A1 | 4/2014 | Lambert |
| 2014/0136414 A1 | 5/2014 | Abhyanker |
| 2014/0188776 A1 | 7/2014 | Shuster |
| 2015/0088335 A1 | 3/2015 | Lambert |
| 2015/0134226 A1 | 5/2015 | Palmer |
| 2015/0178998 A1 | 6/2015 | Attard |
| 2015/0197246 A1 | 7/2015 | Nagasaka |
| 2015/0254781 A1 | 9/2015 | Binion |
| 2015/0316386 A1 | 11/2015 | Delp |
| 2016/0146618 A1 | 5/2016 | Caveney |
| 2016/0210382 A1 | 7/2016 | Alaniz |
| 2017/0115378 A1 | 4/2017 | Haghighi |
| 2017/0123422 A1 | 5/2017 | Kentley |
| 2017/0269606 A1 | 9/2017 | Kawabata |
| 2017/0349172 A1 | 12/2017 | Kubota |
| 2018/0005527 A1 | 1/2018 | Bostick |
| 2018/0190124 A1 | 7/2018 | Kim |
| 2018/0201264 A1 | 7/2018 | Schoenly |
| 2018/0224857 A1 | 8/2018 | Yang |
| 2019/0088135 A1 | 3/2019 | Do |
| 2019/0146492 A1 | 5/2019 | Phillips |
| 2019/0163182 A1 | 5/2019 | Li |
| 2019/0265712 A1 | 8/2019 | Satzoda |
| 2020/0005662 A1 | 1/2020 | Palmer |
| 2020/0183387 A1 | 6/2020 | Heit |
| 2022/0005291 A1 | 1/2022 | Konrardy |

SYSTEMS AND METHODS FOR GENERATING AND PROVIDING TIMELY VEHICLE EVENT INFORMATION

FIELD

The systems and methods disclosed herein are related to generating and providing timely vehicle event information for a fleet of vehicles. In particular, information regarding detected vehicle events may be analyzed to determine whether the detected vehicles events are relevant (e.g., not duplicative) to add to a set of vehicle events scenarios.

BACKGROUND

Systems configured to record, store, and transmit video, audio, and sensor data associated with a vehicle, e.g. responsive to an accident involving the vehicle, are known. Typically, such systems detect an accident based on data from a single sensor such as an accelerometer. Some systems store information locally for subsequent analysis. Vehicle Engine Control Component (ECM) systems are known. Such systems interface/interoperate with external computers (e.g., at an automobile mechanic) where the data stored by the ECM system is analyzed.

SUMMARY

One aspect of the disclosure relates to a system configured to generate and provide timely vehicle event information for a fleet of vehicles including at least a first vehicle. The fleet of vehicles may include one or more of a first vehicle, a second vehicle, a third vehicle, and/or a fourth vehicle, and so forth. Individual vehicles may include a set of resources for data processing and/or electronic storage, including but not limited to persistent storage. As used herein, transmission and/or distribution of information may be considered a data processing function. As used herein, the terms data and information may be used interchangeably. Individual vehicles may include a set of sensors configured to generate output signals conveying information related to one or more of the physical surroundings of the individual vehicles and/or the operating conditions of the individual vehicles. Individual vehicles may communicate with each other and/or with a remote computing server. The system may include one or more sets of resources, one or more sets of sensors, a remote computing server (which may also be referred to as centralized server or centralized cloud server), and/or other components.

One or more components of the system may include one or more processors and/or other mechanisms/components for processing information. For example, a set of resources included in and/or carried by an individual vehicle may include one or more processors. For example, the remote computing server may include one or more processors. In some implementations, other vehicle-specific components, such as, by way of non-limiting example, a vehicle event recorder, may include one or more processors. In some implementations, some or all of the processors may be configured via machine-readable instructions to perform various functions. As used herein, the term "processor" is used interchangeably with the term "physical processor."

A set of resources included in and/or carried by an individual vehicle may include one or more processors, electronic storage, a transceiver, and/or other components. The first vehicle may carry a first set of resources. The second vehicle may carry a second set of resources, and so forth. The first set of resources may include a first transceiver. The second set of resources may include a second transceiver, and so forth.

Transceivers may be configured to transfer and/or receive information to and/or from other elements of the system, including but not limited to other vehicles (or components carried by other vehicles), the remote computing server, and/or other components. In some implementations, transceivers may be configured to transfer and/or receive information wirelessly, and/or otherwise provide resources for the distribution of information. For example, a transceiver may be configured to receive executable code, queries, requests, and/or other information. For example, a transceiver may be configured to transmit results from executable code, responses to queries, information regarding detected vehicle events, and/or other information, e.g., to a remote computing server. In some implementations, transceivers may be configured to obtain, measure, and/or otherwise determine one or more conditions related to data transmissions. For example, one or more current local data transmission conditions may include a current bandwidth (e.g., in MB/s), a current transmission protocol (e.g., LTE, 3G, 4G, 5G, Wi-Fi, etc.), a current transmission cost (e.g., in $/MB), and/or other conditions.

A set of sensors may be configured to generate output signals conveying information. In some implementations, the generated information may be related to one or more of the physical surroundings of individual vehicles and/or the operating conditions of individual vehicles. In some implementations, the generated information may be related to circumstances around individual vehicles. An individual set of sensors may be carried by an individual vehicle. The generated information may include timing information, location information, positional information, (vehicle) operator information, traffic information, roadway information, weather information, visibility information, information related to vehicle events, and/or other information. In some implementations, generated information may be associated with timing information (e.g., from a timer), location information, (vehicle) operator information, and/or other information.

In some implementations, timing information may associate and/or otherwise relate the generated output signals with one or more moments of generation by one or more particular sensors. For example, timing information may include time stamps that indicate moments of generation. For example, at a time labeled $t_1$ the speed of a vehicle may be 50 mph, at a time labeled $t_2$ the speed may be 55 mph, and so forth. A set of time stamps or moments in time may form a timeline. In some implementations, location information may associate and/or otherwise relate the generated output signals with one or more locations of generation (or, locations at the moment of generation) by one or more particular sensors. In some implementations, the operator information may associate and/or otherwise relate the generated output signals with individual vehicle operators at the moments of generation. For example, a particular sensor may generate a particular output signal conveying a particular operating parameter of an individual vehicle, such as speed and/or another operating parameter. The particular output signal may include and/or be associated with a timestamp (e.g., time=$t_x$) that indicates when the particular output signal was generated. For example, a series of output signals may be associated with a corresponding series of timestamps. In some implementations, the particular output signal may be associated with a particular vehicle operator. For example, the particular output signal may be associated with the particular vehicle operator that was operating the individual vehicle at the time the particular output signal was generated. In some implementations, a set of resources may be configured to store generated information, timing information, location information, operator information, and/or other information, e.g. in electronic storage.

In some implementations, a sensor may be configured to generate output signals conveying information related to the operation of the vehicle (which may include information related to one or more operating conditions of the vehicle). Information related to the operation of the vehicle may include feedback information from one or more of the mechanical systems of the vehicle, and/or other information. In some implementations, at least one of the sensors may be a vehicle system sensor included in an engine control module (ECM) system or an electronic control module (ECM) system of the vehicle. In some implementations, one or more sensors may be carried by the vehicle. The sensors of a particular vehicle may be referred to as a set of sensors. An individual sensor may be vehicle-specific.

Individual sensors may be configured to generate output signals conveying information, e.g., vehicle-specific information. The information may include visual information, motion-related information, position-related information, biometric information, and/or other information. In some implementations, one or more components of the system may determine one or more parameters that are measured, derived, estimated, approximated, and/or otherwise determined based on one or more output signals generated by one or more sensors.

Sensors may include, by way of non-limiting example, one or more of an altimeter (e.g. a sonic altimeter, a radar altimeter, and/or other types of altimeters), a barometer, a magnetometer, a pressure sensor (e.g. a static pressure sensor, a dynamic pressure sensor, a pitot sensor, etc.), a thermometer, an accelerometer, a gyroscope, an inertial measurement sensor, global positioning system sensors, a tilt sensor, a motion sensor, a vibration sensor, an image sensor, a camera, a depth sensor, a distancing sensor, an ultrasonic sensor, an infrared sensor, a light sensor, a microphone, an air speed sensor, a ground speed sensor, an altitude sensor, medical sensors (including but not limited to blood pressure sensor, pulse oximeter, heart rate sensor, etc.), degree-of-freedom sensors (e.g. 6-DOF and/or 9-DOF sensors), a compass, and/or other sensors. As used herein, the term "motion sensor" may include one or more sensors configured to generate output conveying information related to position, location, distance, motion, movement, acceleration, and/or other motion-based parameters. Output signals generated by individual sensors (and/or information based thereon) may be stored and/or transferred in electronic files. In some implementations, output signals generated by individual sensors (and/or information based thereon) may be streamed to one or more other components of the system.

As mentioned, individual sensors may include image sensors, cameras, and/or other sensors. As used herein, the terms "camera" and/or "image sensor" may include any device that captures images, including but not limited to a single lens-based camera, a camera array, a solid-state camera, a mechanical camera, a digital camera, an image sensor, a depth sensor, a remote sensor, a lidar, an infrared sensor, a (monochrome) complementary metal-oxide-semiconductor (CMOS) sensor, an active pixel sensor, and/or other sensors. Individual sensors may be configured to capture information, including but not limited to visual information, video information, audio information, geolocation information, orientation and/or motion information, depth information, and/or other information. Information captured by one or more sensors may be marked, time-stamped, annotated, and/or otherwise processed such that information captured by other sensors can be synchronized, aligned, annotated, and/or otherwise associated therewith. For example, video information captured by an image sensor may be synchronized with information captured by an accelerometer, GPS unit, or other sensor. Output signals generated by individual image sensors (and/or information based thereon) may be stored and/or transferred in electronic files, or streamed.

In some implementations, an image sensor may be integrated with electronic storage such that captured information may be stored, at least initially, in the integrated embedded storage of a particular vehicle. In some implementations, one or more components carried by an individual vehicle may include one or more cameras. For example, a camera may include one or more image sensors and electronic storage media. In some implementations, an image sensor may be configured to transfer captured information to one or more components of the system, including but not limited to remote electronic storage media, e.g. through "the cloud." In some implementations, the captured information may be analyzed and/or otherwise processed to detect and/or extract information, and subsequently the detected and/or extracted information may be transferred to and/or stored by one or more components of the system. For example, captured information may be analyzed using computer vision techniques such that information related to the physical surroundings of an individual vehicle may be extracted from the captured information. Advantageously, extracted information may be compressed into a much smaller amount of information than the originally captured information. For example, captured information of a sufficiently high resolution may be analyzed using computer vision techniques to determine the make and model (and/or size, color, license plate, characteristics of the vehicle operator, number of passengers, apparent damage on the visible side, etc. etc.) of a vehicle passing in the adjacent lane. This determined information can be stored in a small amount of memory, which may be much smaller than the amount that would be needed to store the captured visual information.

The system may be coupled to individual vehicles. For example, the system may be communicatively coupled to individual vehicles and/or to components carried by individual vehicles, including but not limited to transceivers. For example, components of the system may be configured to communicate through one or more networks. The one or more networks may, by way of non-limiting example, include the internet. In some implementations, the one or more networks may include a cellular network and/or another communication grid.

The remote computing server may include one or more processors. The remote computing server may be remote, separate, and/or discrete from the fleet of vehicles. The one or more processors may be configured via machine-readable instructions to perform various functions. The remote computing server may be configured to facilitate presentation of a user interface to a user of the remote computing server, including but not limited to a third party using the remote computing server to query the fleet of vehicles. The user interface may be configured to facilitate interaction between one or more users and the remote computing server. For example, the user interface may be configured to receive user input, executable code, and/or other information from a user. The remote computing server may be further configured to transmit information based on received user input, received executable code, and/or other received information to some vehicles in the fleet or to all vehicles of the fleet. Information from individual vehicles, including but not limited to responses, results, detected vehicle events, physical surroundings, and/or other information generated by individual vehicles, may be transferred to, received by, and processed, analyzed, and/or presented by the remote computing server.

In some implementations, a set of resources included in and/or carried by an individual vehicle may include an event recorder (also referred to as vehicle event recorder). An event recorder may be configured to generate, detect, identify, capture, and/or record information related to the operation and/or the physical surroundings of a vehicle. Such information may include, by way of non-limiting example, information related to and/or based on vehicle events. An event recorder may be configured to off-load and/or otherwise transmit information. In some implementations, an event recorder may include one or more physical processors, electronic storage, and/or other components. In some implementations, an event recorder may detect vehicle events based on a comparison of the information conveyed by the output signals from one or more sensors to predetermined (variable and/or fixed) values, threshold, functions, and/or other information. An event recorder may identify vehicle events and/or other information related to the operation of a vehicle in real-time or near real-time during operation of a vehicle. In some implementations, an event recorder may identify vehicle events and/or other information related to the operation of a vehicle based on previously stored information. For example, the previously stored information may be based on output signals generated days, weeks, months or more ago.

As used herein, the term "vehicle event" may refer to forward motion, motion in reverse, making a turn, speeding, unsafe driving speed, collisions, near-collisions, driving in a parking lot or garage, being stalled at a traffic light, loading and/or unloading of a vehicle, transferring gasoline to or from the vehicle, and/or other vehicle events in addition to driving maneuvers such as swerving, a U-turn, freewheeling, over-revving, lane-departure, short following distance, imminent collision, unsafe turning that approaches rollover and/or vehicle stability limits, hard braking, rapid acceleration, idling, driving outside a geo-fence boundary, crossing double-yellow lines, passing on single-lane roads, a certain number of lane changes within a certain amount of time or distance, fast lane change, cutting off other vehicles during lane-change speeding, running a red light, running a stop sign, parking a vehicle, performing fuel-inefficient maneuvers, and/or other driving maneuvers or combinations thereof. Some types of vehicle events may be based on the actions or motion of the vehicle itself. Other types of vehicle events may be based on the actions taken or performed by a vehicle operator. Some types of vehicle events may be based on a combination of both the actions or motion of the vehicle itself and the actions taken or performed by a vehicle operator. For example, a particular vehicle event may include hard braking followed (within a predetermined window of time) by a sharp turn and/or swerve. This particular vehicle event may indicate a near-collision that was severe enough that the vehicle operator decided that merely braking hard would not be sufficient to avoid the collision. Another example of a vehicle event that includes a combination of actions may be a lane change followed (within a predetermined window of time) by hard braking, which may indicate a poor decision to initiate the lane change.

Some types of vehicle events may be based on the actions or motion of the vehicle itself. Some types of vehicle events may be based on the actions or motion of nearby vehicles. Other types of vehicle events may be based on the actions taken or performed by a vehicle operator. Some types of vehicle events may be based on the actions taken or performed by vehicle operators of nearby vehicles. Some types of vehicle events may be based on a combination of the actions or motion of the vehicle itself, nearby vehicles, and/or the actions taken or performed by a particular vehicle operator or nearby vehicle operator. For example, a particular vehicle event may include hard braking followed (within a predetermined window of time) by a sharp turn and/or swerve. This particular vehicle event may indicate a near-collision that was severe enough that the vehicle operator decided that merely braking hard would not be sufficient to avoid the collision. Another example of a vehicle event that includes a combination of actions may be a lane change followed (within a predetermined window of time) by hard braking, which may indicate a poor decision to initiate the lane change. Another example of a vehicle event that includes a combination of actions may be a lane change followed (within a predetermined window of time) by a maneuver performed by a nearby vehicle (e.g., hard braking or swerving), which may indicate a nearby vehicle operator was at least surprised by the lane change.

The one or more processors of the remote computing server and/or of individual sets of resources may be configured to execute one or more computer program components. The computer program components may include one or more of a presentation component, an interface component, a distribution component, a report component, a scenario component, a relevance component, a parameter determination component, an event detection component, a storage component, a trend component, a simulation component, and/or other components.

The presentation component may be configured to facilitate presentation of user interfaces, reports, detected vehicle events, information regarding physical surroundings of vehicles, and/or results to users, third parties, and/or vehicle operators. In some implementations, the presentation component may facilitate presentation, e.g., of a user interface, to a user of the remote computing server. In some implementations, the presentation component may facilitate presentation, e.g., of one or more user interfaces, to one or more vehicle operators. In some implementations, the presentation component may facilitate presentation, e.g., of one or more reports, results, and/or user interfaces, to a third party.

The interface component may be configured to facilitate interaction with users. For example, the interface component may facilitate interaction through user interfaces. For example, the interface component may receive user input through a user interface. In some implementations, the interface component may receive user input from the user of a remote computing server. In some implementations, the interface component may receive user input from vehicle operators. In some implementations, the interface component may receive user input from a third party.

The distribution component may be configured to transmit information to and/or from the remote computing server, from and/or to all or part of a fleet of vehicles. In some implementations, the distribution component may be configured to transmit information from the remote computing server to all or part of the transceivers that are included in and/or carried by a fleet of vehicles. In some implementations, the distribution component may be configured to transmit information to the remote computing server from all or part of the transceivers that are included in and/or carried by a fleet of vehicles. In some implementations, transmission may be wireless. In some implementations, transmission may be point-to-point. In some implementations, transmission may be broadcast. In some implementations, transmission may be bi-directional. For example, the distribution component may be configured to transmit queries and/or executable code from the remote computing server to individual vehicles in a fleet, e.g., based on the current locations of the individual vehicles. For example, the distribution component may be configured to transmit information regarding detected vehicle events to the remote computing server from individual vehicles in a fleet. For example, individual transceivers may be configured to receive queries and/or executable code transmitted by the distribution component. In some implementations, the presentation component, interface component, and/or one or more other components of the system may be configured to determine and/or present one or both of warnings and/or recommendations to a vehicle operator.

The parameter determination component may be configured to derive, determine, and/or otherwise generate physical surroundings in which individual vehicles are operating, current operating conditions of individual vehicles, and/or vehicle parameters of individual vehicles. Operation of the parameter determination component may be based on information conveyed by the output signals that are generated by sensors, and/or based on other information.

Physical surroundings of an individual vehicle may include static parameters (e.g., related to objects that are static), dynamic parameters (e.g., related to objects that are dynamic), and/or other parameters. For example, static parameters may include parameters related to roadside objects, roadside infrastructure (bridges, cross streets, signage, railroad crossings, etc.), and/or other parameters. For example, the dynamic parameters may include speed parameters of the individual vehicle, speed parameters of other vehicles, distance parameters, positional parameters, roadway parameters (e.g., related to the local surface of the road), and/or other parameters.

The one or more current operating conditions may be related to the vehicle, the operation of the vehicle, physical characteristics of the vehicle, and/or other information. In some implementations, the parameter determination component may be configured to determine one or more of the current operating conditions one or more times in an ongoing manner during operation of the vehicle. In some implementations, the parameter determination component may be configured to determine one or more of the parameters one or more times in an ongoing manner during operation of the vehicle.

The event detection component may be configured to detect vehicle events. In some implementations, vehicle events may be related to current operating conditions of a vehicle. In some implementations, vehicle events may be related to the physical surroundings of a vehicle. In some implementations, vehicle events may be related to the operator of a vehicle. For example, a vehicle event may be based on comparing one or more vehicle parameters with one or more thresholds. By way of non-limiting example, a vehicle event may be any event of interest to a vehicle operator, a fleet owner or operator, and/or an entity interested in the vehicle, its route, or its contents/cargo.

The scenario component may be configured to control access to vehicle event scenarios that are associated with vehicle events. Access control may include permission to read, write, and/or modify information, e.g., a stored set of vehicle event scenarios that are associated with vehicle events. The individual vehicle event scenarios may represent circumstances and/or physical surroundings around vehicles. For example, a vehicle event scenario may represent circumstances and/or physical surroundings for at least a predefined period prior to occurrences of potential and/or actual vehicle events. For example, a particular vehicle event scenario may be based on a real-life vehicle event of a vehicle accident. The corresponding vehicle event scenario may present the same or similar circumstances that lead to the vehicle accident. However, if a vehicle operator would act differently when presented with the corresponding vehicle event scenario, a vehicle event (e.g., an accident) may be prevented and/or preventable. Accordingly, a vehicle event scenario may be related to a potential vehicle event.

The individual vehicle event scenarios may include individual geographical locations. In some implementations, the scenario component may be configured to add one or more vehicle event scenarios to the stored set of vehicle event scenarios. In some implementations, the scenario component may be configured to remove one or more vehicle event scenarios from the stored set of vehicle event scenarios. In some implementations, a set of vehicle event scenarios may include vehicle event scenarios based on real-life vehicle events that have been detected at some time. In some implementations, a set of vehicle event scenarios may include vehicle event scenarios that are not based on real-life vehicle events, but rather created artificially, e.g., by human programming.

The relevance component may be configured to determine event-specific relevance metrics for vehicle events. In some implementations, determinations by the relevance component may be based on received information, e.g., received information regarding detected vehicle events. In some implementations, the event-specific relevance metric may indicate a level of relevance for the detected vehicle event. The relevance component may be configured to compare the event-specific relevance metric to a relevance threshold. In some implementations, responsive to the event-specific relevance metric at least meeting the relevance threshold, the relevance component may be configured to add a new vehicle event scenario to either a set of new vehicle event scenarios that are not included in the stored set of vehicle event scenarios, or to the stored set of vehicle event scenarios. The new vehicle event scenario may be based on received information, e.g., received information regarding a detected vehicle event. In some implementations, the set of new vehicle event scenarios may represent circumstances and/or physical surroundings around particular vehicles, the vehicles being related to vehicle events.

In some implementations, an event-specific relevance metric may be based at least in part on a geographical location that is associated with a detected vehicle event. In some implementations, an event-specific relevance metric may be determined based one or more comparisons with information included in one or more vehicle event scenarios, e.g., the stored set of vehicle event scenarios. In some implementations, an event-specific relevance metric may increase in relevance responsive to the received information (for a particular detected vehicle event) being dissimilar to the information included in a set of vehicle event scenarios. In some implementations, an event-specific relevance metric may decrease in relevance responsive to the received information (for a particular detected vehicle event) being similar to the information included in a set of vehicle event scenarios. In some implementations, an event-specific relevance metric may indicate a level of relevance by quantifying one or both of uniqueness and/or distinctiveness of the received information (for a particular detected vehicle event) compared to the information included in a set of vehicle event scenarios.

The trend component may be configured to determine whether a new vehicle event scenario, a set of new vehicle event scenarios, and/or a stored set of vehicle event scenarios are indicative of a trend in detected vehicle events. The determination may be based on a statistical analysis. For example, the determination may be based on a comparison between the geographical location of a detected vehicle event and the geographical locations of other vehicle events. Alternatively, and/or simultaneously, the date and/or time of day of a detected vehicle event may be compared with the dates and/or times of day of other vehicle events. Alternatively, and/or simultaneously, other parameters, characteristics, and/or vehicle-specific information of a detected vehicle event may be compared with similar information of other vehicle events.

A trend may correspond to an increase in a particular type of vehicle events compared to an expectation for the particular type of vehicle events. In some implementations, the expectation may be based on historical vehicle event information. In some implementations, the expectation may be based on analysis of a set of vehicle event scenarios. For example, the expectation may be based on mathematical probabilities. In some implementations, the trend component may be configured to determine mathematical probabilities of certain vehicle events or vehicle event scenarios (based on historical information and/or information extracted from a set of vehicle event scenarios), compare whether the likelihood and/or probability of certain vehicle events or vehicle event scenarios exceeds a trend-related threshold, and determine whether a trend is occurring based on that comparison.

The storage component may be configured to store information in electronic storage. For example, the information may be stored in the electronic storage of a particular vehicle. In some implementations, the stored information may be related to detected vehicle events, determined vehicle parameters, executable code, vehicle event scenarios, and/or other information. In some implementations, the storage component may be configured to store vehicle event records of detected vehicle events in electronic storage.

The report component may be configured to generate reports associated with one or more of generated output signals, detected vehicle events, information regarding physical surroundings of vehicles, vehicle event scenarios, responses to queries, results from executable code, and/or other information. In some implementations, the report component may be configured to publish reports, e.g. by posting it online (using either free or restricted access to the published reports) or through other mechanisms that effectuate publication. In some implementations, the report component may be configured to transfer reports to users, third parties, and/or other entities interested in one or more of the vehicles, vehicle events, vehicle routes, or vehicle contents/cargo. Reports may include information captured by image sensors during detected vehicle events. In some implementations, reports may include information that is derived from and/or based on information captured by image sensors during detected vehicle events.

In some implementations, third parties may obtain a subscription to one or more reports, and may obtain the reports through access to a restricted online area, site, or portal where the reports are posted and/or published. For example, a third party may obtain a subscription to a report covering all events meeting certain constraints, such as geographical constraints corresponding to a particular city or trucking route. For example, a third party may obtain a subscription to a report covering all events having a particular vehicle event type (which may be independent of geographical location).

In some implementations, reports may be generated, posted, and/or published timely, regularly, and/or at intervals not to exceed a maximum interval period. In some implementations, the maximum interval period may be 1 day, 2 days, 3 days, 4 days, 5 days, 6 days, 1 week, 10 days, 2 weeks, 3 weeks, a month, 2 months, 3 months, 90 days, and/or another period.

The simulation component may be configured to create a simulation scenario and/or model that mimics the physical surroundings of a particular vehicle and/or the circumstances around the particular vehicle at the time of a detected vehicle event involving the particular vehicle and/or a nearby vehicle.

In some implementations, one or more components of the system may be configured to obtain, receive, and/or determine contextual information related to environmental conditions near and/or around vehicles. Environmental conditions may be related to weather conditions, traffic conditions, visibility, and/or other environmental conditions. In some implementations, one or more environmental conditions may be received from one or more sources external to the vehicle. For example, a source external to the vehicle may include an external provider.

In some implementations, detection of vehicle events may further be based one or more types of contextual information. In some implementations, detection may be accomplished and/or performed at the vehicle.

As used herein, any association (or relation, or reflection, or indication, or correspondency) involving vehicles, sensors, vehicle events, operating conditions, parameters, thresholds, functions, notifications, discrepancies, location-specific features, and/or another entity or object that interacts with any part of the system and/or plays a part in the operation of the system, may be a one-to-one association, a one-to-many association, a many-to-one association, and/or a many-to-many association or N-to-M association (note that N and M may be different numbers greater than 1).

As used herein, the term "obtain" (and derivatives thereof) may include active and/or passive retrieval, determination, derivation, transfer, upload, download, submission, and/or exchange of information, and/or any combination thereof. As used herein, the term "effectuate" (and derivatives thereof) may include active and/or passive causation of any effect. As used herein, the term "determine" (and derivatives thereof) may include measure, calculate, compute, estimate, approximate, generate, and/or otherwise derive, and/or any combination thereof.

These and other objects, features, and characteristics of the servers, systems, and/or methods disclosed herein, as well as the methods of operation and functions of the related elements of structure and the combination of parts and economies of manufacture, will become more apparent upon consideration of the following description and the appended claims with reference to the accompanying drawings, all of which form a part of this disclosure, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1:
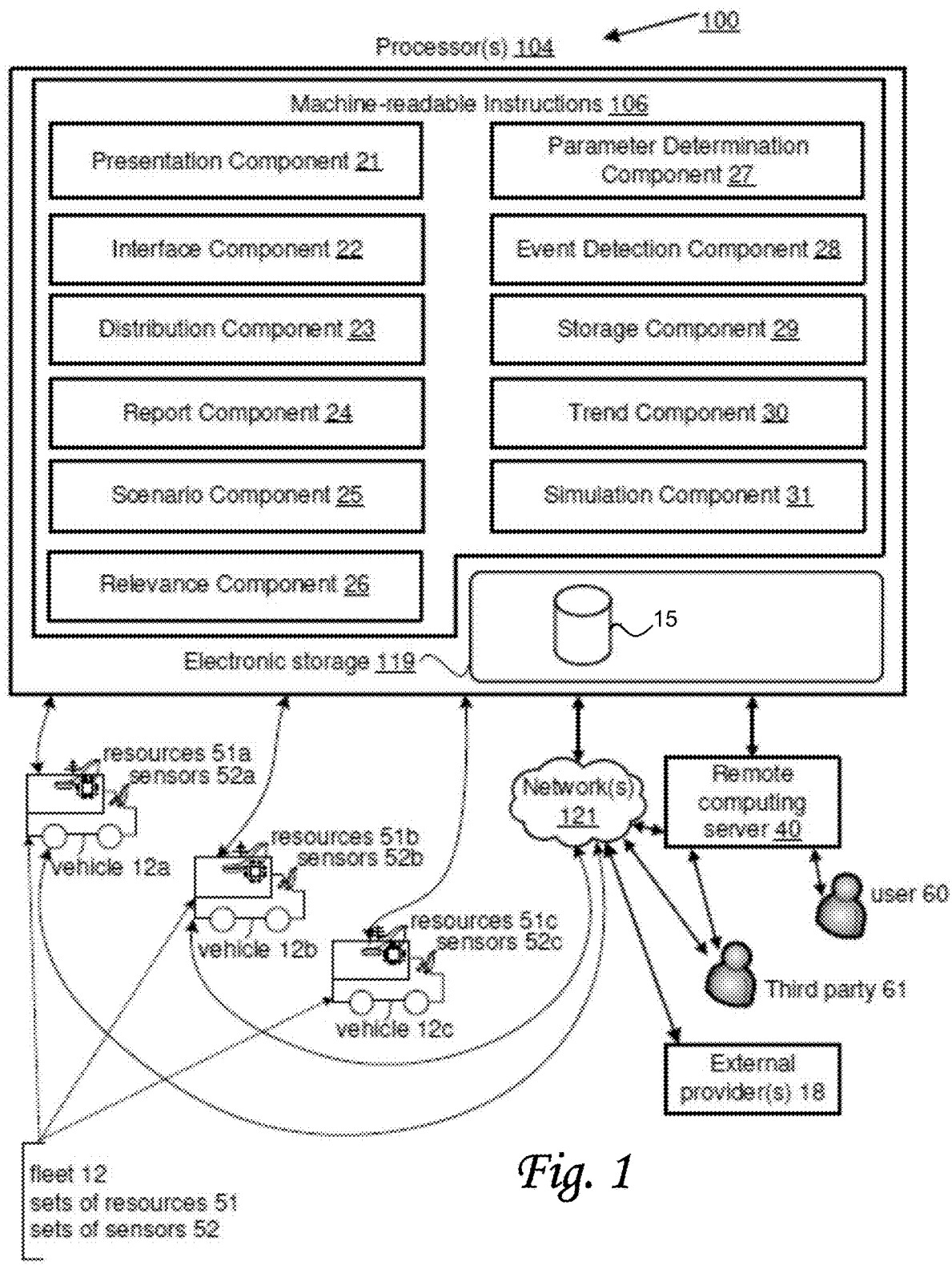
FIG. 1 illustrates a system configured to generate and provide timely vehicle event information for a fleet of vehicles, in accordance with one or more embodiments.

FIG. 1 illustrates a system 100 configured to generate and provide timely vehicle event information for a fleet 12 of vehicles. Fleet 12 may include a first vehicle 12a, a second vehicle 12b, a third vehicle 12c, and so forth. As used here, the term fleet may refer to a set of at least 5 vehicles, at least 10 vehicles, at least 100 vehicles, at least 1000 vehicles, and/or another number of vehicles. The number of vehicles depicted in FIG. 1 is not intended to be limiting.

Individual vehicles may include a set of resources for data processing and/or electronic storage, including but not limited to persistent storage. Individual vehicles may include a set of sensors configured to generate output signals conveying information related to the operation of the individual vehicles. System 100 may include sets of resources 51, sets of sensors 52, a remote computing server 40, electronic storage 119, and/or other components. In some implementations, system 100 may be a distributed data center, include a distributed data center, or act as a distributed data center.

One or more components of system 100 may include one or more processors 104 and/or other mechanisms/components for processing information. For example, a set of resources included in and/or carried by an individual vehicle may include one or more processors. For example, remote computing server 40 may include one or more processors. In some implementations, other vehicle-specific components, such as, by way of non-limiting example, a vehicle event recorder, may include one or more processors. In some implementations, some or all of the processors may be configured via machine-readable instructions to perform various functions. One or more components of system 100 may include electronic storage 119 and/or other mechanisms/components for storing information. For example, a set of resources included in and/or carried by an individual vehicle may include (local) electronic storage. For example, remote computing server 40 may include electronic storage. In some implementations, other vehicle-specific components, such as, by way of non-limiting example, a vehicle event recorder, may include electronic storage.

By way of non-limiting example, sets of resources 51 (e.g. set of resources 51c carried by vehicle 12c) may include electronic storage, a processor, a transceiver, an event recorder, and/or other vehicle-specific components. First vehicle 12a may carry a first set of resources 51a. Second vehicle 12b may carry a second set of resources 51b. Third vehicle 12c may carry a third set of resources 51c, and so forth. Each set of resources may include instances of electronic storage, a processor, a transceiver, an event recorder, and/or other vehicle-specific components. First set of resources 51a may include a first transceiver. Second set of resources 51b may include a second transceiver, and so forth. For example, first set of resources 51a may include first electronic storage, second set of resources 51b may include second electronic storage, third set of resources 51c may include third electronic storage, and so forth. For example, first set of resources 51a may include one or more processors, second set of resources 51b may include one or more processors, third set of resources 51c may include one or more processors, and so forth.

Transceivers may be configured to transfer and/or receive information to and/or from other elements of system 100, including but not limited to other vehicles (or components carried by other vehicles in fleet 12), remote computing server 40, a third party 61, and/or other components. In some implementations, transceivers may be configured to transfer and/or receive information wirelessly, and/or otherwise provide information-distribution resources. For example, a transceiver may be configured to receive executable code, such as code that includes and/or represents a definition of a particular vehicle event, a particular maneuver of a vehicle, and/or a particular condition of a vehicle operator of a vehicle. In some implementations, transceivers may be configured to obtain, receive, measure, and/or otherwise determine one or more conditions related to data transmissions. For example, one or more current local data transmission conditions may include a current bandwidth (e.g., in MB/s), a current transmission protocol (e.g., LTE, 3G, 4G, 5G, Wi-Fi, etc.), a current transmission cost (e.g., in $/MB), and/or other conditions.

Referring to FIG. 1, a set of sensors 52 may be configured to generate output signals conveying information. In some implementations, the generated information may be related to the operation of one or more vehicles in fleet 12. In some implementations, the generated information may be related to the physical surroundings of one or more vehicles in fleet 12. In some implementations, the generated information may be related to the circumstances around one or more vehicles in fleet 12. An individual set of sensors 52 may be carried by an individual vehicle. First vehicle 12a may carry a first set of sensors 52a. Second vehicle 12b may carry a second set of sensors 52b. Third vehicle 12c may carry a third set of sensors 52c, and so forth. The generated information may include timing information, location information, operator information, and/or other information. In some implementations, generated information may be associated with timing information (e.g., from a timer), location information, operator information, and/or other information.

In some implementations, timing information may associate and/or otherwise relate the generated output signals with one or more moments of generation by one or more particular sensors. For example, timing information may include time stamps that indicate moments of generation. For example, at a time labeled $t_1$ the speed of a vehicle may be 50 mph, at a time labeled $t_2$ the speed may be 55 mph, and so forth. A set of time stamps or moments in time may form a timeline. In some implementations, location information may associate and/or otherwise relate the generated output signals with one or more locations of generation (or, locations at the moment of generation) by one or more particular sensors. In some implementations, the operator information may associate and/or otherwise relate the generated output signals with individual vehicle operators at the moments of generation. For example, a particular sensor may generate a particular output signal conveying a particular operating parameter of an individual vehicle, such as speed and/or another operating parameter. The particular output signal may include and/or be associated with a timestamp (e.g., time=$t_x$) that indicates when the particular output signal was generated. For example, a series of output signals may be associated with a corresponding series of timestamps. In some implementations, the particular output signal may be associated with a particular vehicle operator. For example, the particular output signal may be associated with the particular vehicle operator that was operating the individual vehicle at the time the particular output signal was generated. In some implementations, a set of resources 51 may be configured to store generated information, timing information, location information, operator information, and/or other information, e.g. in electronic storage. In some implementations, information may be stored after compression, filtering, and/or other processing to reduce the required amount of storage space.

A sensor may be configured to generate output signals conveying information related to the operation of a vehicle. Information related to the operation of a vehicle may include feedback information from one or more of the mechanical systems of the vehicle, and/or other information. In some implementations, at least one of the sensors may be a vehicle system sensor included in an engine control module (ECM) system or an electronic control module (ECM) system of the vehicle. The sensors of a particular vehicle may be referred to as a set of sensors. An individual sensor is vehicle-specific.

Information related to current operating conditions of a vehicle may include feedback information from one or more of the mechanical systems of the vehicle, the electrical systems of the vehicle, and/or other information. The mechanical systems of a vehicle may include, for example, the engine, the drive train, the lighting systems (e.g., headlights, brake lights), the braking system, the transmission, fuel delivery systems, and/or other mechanical systems. The mechanical systems of a vehicle may include one or more mechanical sensors, electronic sensors, and/or other sensors that generate the output signals (e.g., seat belt sensors, tire pressure sensors, etc.). In some implementations, at least one of the sensors carried by a vehicle may be a vehicle system sensor included in an ECM system of the vehicle.

In some implementations, information related to current operating conditions of a vehicle may include information related to the environment in and/or around the vehicle. The vehicle environment may include spaces in and around an interior and an exterior of the vehicle. The information may include information related to movement of the vehicle, an orientation of the vehicle, a geographic position of the vehicle, a spatial position of the vehicle relative to other objects, a tilt angle of the vehicle, an inclination/declination angle of the vehicle, and/or other information. In some implementations, the output signals conveying information may be generated via non-standard aftermarket sensors installed in the vehicle. Non-standard aftermarket sensors may include, for example, a video camera, a microphone, an accelerometer, a gyroscope, a geolocation sensor (e.g., a GPS device), a radar detector, a magnetometer, radar (e.g. for measuring distance of leading vehicle), and/or other sensors. In some implementations, the set of sensors carried by a vehicle may include multiple cameras positioned around the vehicle and synchronized together to provide a 360-degree view of the interior of the vehicle (e.g., the cabin) and/or a 360-degree view of the exterior of the vehicle.

Although individual sets of sensors 52*a*, 52*b*, and 52*c* are depicted in FIG. 1 as having three elements, this is not intended to be limiting. For individual vehicles, a set of sensors may include one or more sensors located adjacent to and/or in communication with the various mechanical systems of the vehicle, in one or more positions (e.g., at or near the front of the vehicle, at or near the back of the vehicle, on the side of the vehicle, on or near the windshield of the vehicle, facing outward and/or inward, etc.) to accurately acquire information representing the vehicle environment (e.g. visual information, spatial information, orientation information), and/or in other locations. For example, in some implementations, a set of sensors for a particular vehicle may be configured such that a first sensor is located near or in communication with a rotating tire of the vehicle, and a second sensor located on top of the vehicle is in communication with a geolocation satellite.

Individual sensors may be configured to generate output signals conveying information. The information may include visual information, motion-related information, position-related information, biometric information, heat-related information, infra-red information, and/or other information. In some implementations, one or more components of system 100 may determine one or more parameters that are measured, derived, estimated, approximated, and/or otherwise determined based on one or more output signals generated by one or more sensors.

Output signals generated by individual sensors (and/or information based thereon) may be stored and/or transferred in electronic files. In some implementations, output signals generated by individual sensors (and/or information based thereon) may be streamed to one or more other components of system 100.

Individual sensors may include image sensors, cameras, and/or other sensors. Individual sensors may be configured to capture information, including but not limited to visual information, video information, audio information, heat information, geolocation information, orientation and/or motion information, depth information, and/or other information. Information captured by one or more sensors may be marked, timestamped, annotated, and/or otherwise processed such that information captured by other sensors can be synchronized, aligned, annotated, and/or otherwise associated therewith. For example, video information captured by an image sensor may be synchronized with information captured by an accelerometer, GPS unit, or other sensor. Output signals generated by individual image sensors (and/or information based thereon) may be stored and/or transferred in electronic files.

System 100 may be coupled to individual vehicles. For example, system 100 may be communicatively coupled to individual vehicles and/or to components carried by individual vehicles, including but not limited to transceivers. For example, components of system 100 may be configured to communicate through one or more networks 121. The one or more networks 121 may, by way of non-limiting example, include the internet.

Remote computing server 40 may include one or more processors 104. Remote computing server 40 may be remote, separate, and/or discrete from the fleet of vehicles 12. Remote computer server 40 may be physically unconnected to any vehicle in the fleet. One or more processors 104 may be configured via machine-readable instructions 106 to perform various functions. Remote computing server 40 may be configured to facilitate presentation of a user interface to a user 60 of remote computing server 40 and/or third party 61. The user interface may be configured to facilitate interaction between one or more users and remote computing server 40. For example, the user interface may be configured to receive user input from user 60 and/or third party 61. In some implementations, the received input may represent executable code, which may include one or more queries, definitions, and/or algorithms for particular vehicle events, particular maneuvers of vehicles, and/or particular conditions of vehicle operators. In some implementations, the received input may represent a query, e.g. a distributed query. The query may be related to information stored on electronic storage, e.g. in multiple sets of resources of multiple vehicles. Alternatively, and/or simultaneously, a query may be related to one or more vehicle operators. Remote computing server 40 may be further configured to transmit information (e.g., executable code, and/or a query) to some vehicles in the fleet or to all vehicles of the fleet. Results and/or other responses from individual vehicles may be received, aggregated, and/or presented by remote computing server 40.

In some implementations, a set of resources included in and/or carried by an individual vehicle may include an event recorder (also referred to as vehicle event recorder). For example, set of resources 51c carried by the vehicles may include an event recorder. An event recorder may be configured to generate, detect, identify, capture, and/or record information related to the operation of a vehicle. Information related to a vehicle may include, by way of non-limiting example, information related to and/or based on vehicle events. An event recorder may be configured to off-load and/or otherwise transmit information (e.g. through use of a transceiver). In some implementations, an event recorder may include one or more physical processors, electronic storage, and/or other components. In some implementations, an event recorder may detect vehicle events based on a comparison of the information conveyed by the output signals from one or more sensors to predetermined (variable and/or fixed) values, threshold, functions, and/or other information. In some implementations, detections by the event recorder may be based, at least in part, on information included in executable code and/or other information received from a third party. An event recorder may identify vehicle events in real-time or near real-time during operation of a vehicle.

Referring to FIG. 1, one or more processors 104 of remote computing server 40 and/or of individual sets of resources 51 may be configured to execute one or more computer program components. The computer program components may include one or more of a presentation component 21, an interface component 22, a distribution component 23, a report component 24, a scenario component 25, a relevance component 26, a parameter determination component 27, an event detection component 28, a storage component 29, a trend component 30, a simulation component 31, and/or other components.

Presentation component 21 may be configured to facilitate presentation of user interfaces, reports, detected vehicle events, information regarding physical surroundings of vehicles, and/or results to users, third parties, and/or vehicle operators. In some implementations, presentation component 21 may facilitate presentation, e.g., of a user interface, to user 60 of remote computing server 40. In some implementations, presentation component 21 may facilitate presentation, e.g., of a user interface, to one or more vehicle operators. In some implementations, presentation component 21 may facilitate presentation, e.g., of one or more reports, results, and/or user interfaces, to third party 61. This enables information to be communicated between a vehicle operator and/or other components of system 100. As an example, a warning regarding a dangerous driving maneuver and/or vehicle event may be displayed to the driver of the vehicle via such a user interface, e.g. as a notification. Presentation component 21 enables information to be communicated between third party 61 and/or other components of system 100.

Examples of interface devices suitable for inclusion in a user interface include a keypad, buttons, switches, a keyboard, knobs, levers, a display screen, a touch screen, speakers, a microphone, an indicator light, an audible alarm, a printer, a tactile feedback device, and/or other interface devices. It is to be understood that other communication techniques, either hard-wired or wireless, are also contemplated by the present disclosure as a user interface. Other exemplary input devices and techniques adapted for use by users and/or vehicle operators include, but are not limited to, an RS-232 port, RF link, an IR link, modem (telephone, cable, and/or other modems), a cellular network, a Wi-Fi network, a local area network, and/or other devices and/or systems. In short, any technique for communicating information is contemplated by the present disclosure as a user interface.

Interface component 22 may be configured to facilitate interaction with users and/or vehicle operators. For example, a user may be a fleet manager, or someone investigating fleet operations. Interface component 22 may facilitate interaction through user interfaces. For example, interface component 22 may receive user input through a user interface. In some implementations, interface component 22 may receive user input from user 60 of remote computing server 40. In some implementations, interface component 22 may receive user input from third party 61, e.g. via remote computing server 40. In some implementations, the received user input may represent a distributed query, executable code, and/or other information. For example, an entire fleet of vehicles 12 (or any subset thereof) may be queried for particular information. In some implementations, a distributed query or other request may be associated with one or more response constraints. For example, distribution component 23 may be configured to transmit the one or more response constraints to all or part of fleet of vehicles 12.

In some implementations, interface component 22 may be configured to effectuate a review presentation to a user or reviewer, e.g. user 60. A review presentation may be based on information related to one or more detected vehicle events. In some implementations, a review presentation may provide a prompt to a user or reviewer to provide manual review input, e.g., regarding one or more detected vehicle events. For example, a reviewer may be prompted via a question, an inquiry, and/or via other types of prompts. For example, a reviewer may be asked whether a driver was wearing a seatbelt at a particular point in time, or whether one or more lanes appear to be closed, or whether the driver is a nearby vehicle had his eyes on the road. A review presentation may be implemented as a user interface to facilitate interaction for a reviewer. For example, such a user interface may receive review input from a reviewer, including but not limited to manual review input. In some implementations, review input may be responsive to a prompt. In some implementations, a vehicle operator may receive information based on review input. Such information may be referred to as feedback. For example, a user interface for a vehicle operator (this may be referred to as a driver interface) may present a message to a vehicle operator to "remember to wear your seatbelt," responsive to particular review input received from a reviewer (through a different user interface). In some implementations, a driver interface may be configured to detect a vehicle operator's response and/or reaction to specific feedback. In some implementations, the response and/or reaction by a vehicle operator may be specific to the feedback received through the driver interface. In some implementations, review input may be used to update and/or change a report, e.g., a vehicle event report.

Distribution component 23 may be configured to transmit information to and/or from remote computing server 40 from and/or to all or part of fleet of vehicles 12. In some implementations, distribution component 23 may be configured to transmit information from remote computing server 40 to all or part of the transceivers that are included in and/or carried by fleet of vehicles 12. In some implementations, distribution component 23 may be configured to transmit information to remote computing server 40 from all or part of the transceivers that are included in and/or carried by fleet of vehicles 12. In some implementations, transmission may be wireless. In some implementations, transmission may be point-to-point. In some implementations, transmission may be broadcast. In some implementations, transmission may be bi-directional. For example, distribution component 23 may be configured to transmit executable code from remote computing server 40 to individual vehicles in a fleet, e.g., based on the current locations of the individual vehicles. For example, distribution component 23 may be configured to transmit result of a query to remote computing server 40 from some or all of the vehicles in fleet 12. In some implementations, presentation component 21, interface component 22, and/or one or more other components of system 100 may be configured to determine and/or present one or both of warnings and/or recommendations to a vehicle operator, wherein the warnings and/or recommendations are determined based on detected vehicle events and/or other information.

Parameter determination component 27 may be configured to derive, determine, and/or otherwise generate physical surroundings in which individual vehicles are operating, current operating conditions of individual vehicles, and/or vehicle parameters of individual vehicles. Operation of parameter determination component 27 may be based on the information conveyed by the output signals from the sensors and/or other information. Operation of parameter determination component 27 may occur over time, in an ongoing manner, intermittently, and/or otherwise spanning a period of time.

Physical surroundings of an individual vehicle may include static parameters (e.g., related to objects that are static), dynamic parameters (e.g., related to objects that are dynamic), and/or other parameters. For example, static parameters may include parameters related to roadside objects, roadside infrastructure (bridges, cross streets, signage, railroad crossings, potholes, etc.), and/or other parameters. For example, the dynamic parameters may include speed parameters of the individual vehicle, speed parameters of other vehicles (relative and/or absolute), distance parameters between objects and/or vehicles (relative and/or absolute), heading parameters, acceleration parameters, positional parameters, roadway parameters (e.g., related to the local surface of the road, such as the type of road surface, water/ice/snow on the road, slickness of the road, potholes in the road, etc.), and/or other parameters. The physical surroundings of an individual vehicle may be three-dimensional. A set of image sensors may provide 360-degree visual information around the individual vehicle over time, including any of the parameters and/or conditions described here as part of the physical surroundings, as well as other parameters and/or conditions described herein. By determining, deriving, and/or otherwise generating this information at the time of a detected vehicle event, a three-dimensional vehicle event scenario may be created that is similar to the detected vehicle event.

In some implementations, operating conditions may include vehicle parameters. For example, vehicle parameters may be related to one or more of an acceleration, a direction of travel, a turn diameter, a vehicle speed, an engine speed (e.g. RPM), a duration of time, a closing distance, a lane departure from an intended travelling lane of the vehicle, a following distance, physical characteristics of the vehicle (such as mass and/or number of axles, for example), a tilt angle of the vehicle, an inclination/declination angle of the vehicle, and/or other parameters.

The physical characteristics of a vehicle may be physical features of a vehicle set during manufacture of the vehicle, during loading of the vehicle, and/or at other times. For example, the one or more vehicle parameters may include a vehicle type (e.g., a car, a bus, a semi-truck, a tanker truck), a vehicle size (e.g., length), a vehicle weight (e.g., including cargo and/or without cargo), a number of gears, a number of axles, a type of load carried by the vehicle (e.g., food items, livestock, construction materials, hazardous materials, an oversized load, a liquid), vehicle trailer type, trailer length, trailer weight, trailer height, a number of axles, and/or other physical features.

In some implementations, parameter determination component 27 may be configured to determine one or more vehicle parameters based on the output signals from at least two different sensors. For example, parameter determination component 27 may determine one or more of the vehicle parameters based on output signals from a sensor related to the ECM system and an external aftermarket added sensor. In some implementations, a determination of one or more of the vehicle parameters based on output signals from at least two different sensors may be more accurate and/or precise than a determination based on the output signals from only one sensor. For example, on an icy surface, output signals from an accelerometer may not convey that a driver of the vehicle is applying the brakes of the vehicle. However, a sensor in communication with the braking system of the vehicle would convey that the driver is applying the brakes. A value of a braking parameter may be determined based on the braking sensor information even though the output signals from the accelerometer may not convey that the driver is applying the brakes.

Parameter determination component 27 may be configured to determine vehicle parameters that are not directly measurable by any of the available sensors. For example, an inclinometer may not be available to measure the road grade, but vehicle speed data as measured by a GPS system and/or by a wheel sensor ECM may be combined with accelerometer data to determine the road grade. If an accelerometer measures a force that is consistent with braking, but the vehicle speed remains constant, the parameter component can determine that the measured force is a component of the gravity vector that is acting along the longitudinal axis of the vehicle. By using trigonometry, the magnitude of the gravity vector component can be used to determine the road grade (e.g., pitch angle of the vehicle in respect to the horizontal plane).

In some implementations, one or more of the vehicle parameters may be determined one or more times in an ongoing manner during operation of the vehicle. In some implementations, one or more of the vehicle parameters may be determined at regular time intervals during operation of the vehicle. The timing of the vehicle parameter determinations (e.g., in an ongoing manner, at regular time intervals, etc.) may be programmed at manufacture, obtained responsive to user entry and/or selection of timing information via a user interface and/or a remote computing device, and/or may be determined in other ways. The time intervals of parameter determination may be significantly less (e.g. more frequent) than the time intervals at which various sensor measurements are available. In such cases, parameter determination component 27 may estimate vehicle parameters in between the actual measurements of the same vehicle parameters by the respective sensors, to the extent that the vehicle parameters are measurable. This may be established by means of a physical model that describes the behavior of various vehicle parameters and their interdependency. For example, a vehicle speed parameter may be estimated at a rate of 20 times per second, although the underlying speed measurements are much less frequent (e.g., four times per second for ECM speed, one time per second for GPS speed). This may be accomplished by integrating vehicle acceleration, as measured by the accelerometer sensor where the measurements are available 1000 times per second, across time to determine change in speed that is accumulated over time again for the most recent vehicle speed measurement. The benefit of these more frequent estimates of vehicle parameters are many and they include improved operation of other components of system 100, reduced complexity of downstream logic and system design (e.g., all vehicle parameters are updated at the same interval, rather than being updating irregularly and at the interval of each respective sensor), and more pleasing (e.g., "smooth") presentation of vehicle event recorder data through a user interface.

Event detection component 28 may be configured to detect vehicle events. In some implementations, vehicle events may be related to current operating conditions of a vehicle. In some implementations, vehicle events may be related to the physical surroundings of a vehicle. In some implementations, vehicle events may be related to the operator of a vehicle. For example, a vehicle event may be based on comparing one or more vehicle parameters with one or more thresholds. In some implementations, detections may be based on definitions and/or representations of vehicle events, actions and/or conditions of vehicle operators, and/or vehicle maneuvers that are included in executable code. For example, particular executable code from third party 61 may include a definition for the detection of an event that represents an inattentive vehicle operator. Such executable code may be distributed across a fleet of vehicles, and results from the detection of an occurrence of the event that represents an inattentive vehicle operator may be transferred to remote computing server 40, and may be presented to third party 61.

For example, particular executable code from user 60 may include a definition for the detection of an event that represents a fatigued vehicle operator. Such executable code may be distributed across a fleet of vehicles, and results from the detection of an occurrence of the event that represents a fatigued vehicle operator may be transferred to remote computing server 40, and presented to user 60. For example, third party 61 may test and/or compare different algorithms to detect a fatigued vehicle operator. In some implementations, system 100 may be configured to support A/B testing between different algorithms to detect similar events, e.g. to determine algorithm performance under controlled conditions. In some implementations, results from different algorithms (e.g., a default algorithm to detect a fatigued driver and an alternative algorithm to detect a fatigued driver) may be presented to one or more manual reviewers, e.g. for head-to-head comparisons of one or more results. In some implementations, presentation to reviewers (manual and/or otherwise) may be accomplished through user interfaces. For example, a manual reviewer may be able to enter feedback into a user interface as part of a review.

For example, particular executable code from third party 61 may include a definition for the detection of an event that represents a fuel-inefficient maneuver of a vehicle. Such executable code may be distributed across a fleet of vehicles, and results from the detection of an occurrence of the event that represents a fuel-inefficient maneuver may be transferred to remote computing server 40, and subsequently presented.

In some implementations, event detection component 28 may be configured to detect specific driving maneuvers based on one or more of a vehicle speed, an engine load, a throttle level, an accelerator position, vehicle direction, a gravitational force, and/or other parameters being sustained at or above threshold levels for pre-determined amounts of time. In some implementations, an acceleration and/or force threshold may be scaled based on a length of time an acceleration and/or force is maintained, and/or the particular speed the vehicle is travelling. Event detection component 28 may be configured such that force maintained over a period of time at a particular vehicle speed may decrease a threshold force the longer that the force is maintained. Event detection component 28 may be configured such that, combined with engine load data, throttle data may be used to determine a risky event, a fuel wasting event, and/or other events.

Figure 2:
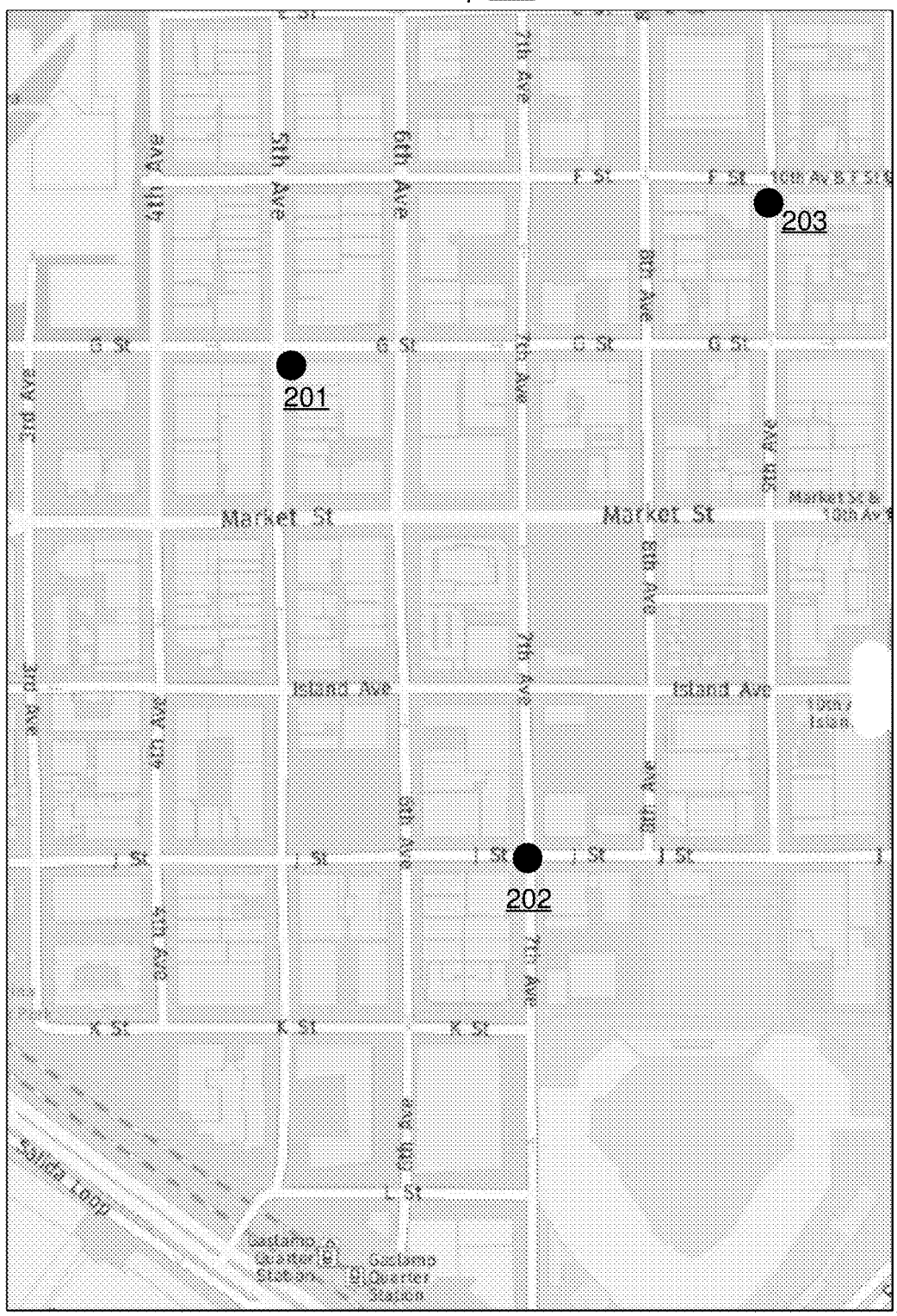
FIG. 2 illustrates an event map showing locations of detected vehicle events, which depicts information that may be used to generate and provide timely vehicle event information, in accordance with one or more embodiments.

By way of non-limiting example, FIG. 2 illustrates an event map 200 showing locations of detected vehicle events, which depicts information that may be used to generate and provide timely vehicle event information by a system similar to system 100. Event map 200 shows locations of detected vehicle events in a particular area, in particular a first event 201, a second event 202, a third event 203, and/or other information. These detected vehicle events may have occurred at different dates and/or times, involving different vehicles, different operators, and/or different vehicle event types. For example, these detected vehicle events may have occurred in the current year. Event map 200 may not show locations of older vehicles events (nor information derived therefrom), but such historical information may be available to system 100.

Referring to FIG. 1, scenario component 25 may be configured to control access to vehicle event scenarios that are associated with vehicle events. Access control may include permission to read, write, and/or modify information, e.g., a stored set of vehicle event scenarios that are associated with vehicle events. The individual vehicle event scenarios may represent circumstances and/or physical surroundings around vehicles. For example, a vehicle event scenario may represent circumstances and/or physical surroundings for at least a predefined period prior to occurrences of potential and/or actual vehicle events. For example, a particular vehicle event scenario may be based on a real-life vehicle event of a vehicle accident. The corresponding vehicle event scenario may present the same or similar circumstances that lead to the vehicle accident. However, if a vehicle operator would act differently when presented with the corresponding vehicle event scenario, a vehicle event (e.g., an accident) may be prevented and/or preventable. Accordingly, a vehicle event scenario may be related to a potential vehicle event.

The individual vehicle event scenarios may include individual geographical locations. In some implementations, scenario component 25 may be configured to add one or more vehicle event scenarios to a stored set 15 of vehicle event scenarios. In some implementations, scenario component 25 may be configured to modify and/or remove one or more vehicle event scenarios from stored set 15 of vehicle event scenarios. In some implementations, a set of vehicle event scenarios may include vehicle event scenarios based on real-life vehicle events that have been detected at some time. In some implementations, a set of vehicle event scenarios may include vehicle event scenarios that are not based on real-life vehicle events, but rather created artificially, e.g., by human programming.

Relevance component 26 may be configured to determine event-specific relevance metrics for vehicle events. In some implementations, determinations by relevance component 26 may be based on received information, e.g., received information regarding detected vehicle events. For example, one or more relevance metrics may be based on one or more of the type of a detected vehicle event, the severity of a detected vehicle event, the particular date of the detected vehicle event (e.g., a holiday, the end of a vacation period, the start or end of daylight savings time, etc.), the particular day and/or time of the detected vehicle event (e.g., outside of rush traffic, in the middle of the night, right after a sporting event ends, after stores close, etc.), a particular type of vehicle involved in the detected vehicle event, and/or other characteristics of the detected vehicle event.

In some implementations, the event-specific relevance metric may indicate a level of relevance for the detected vehicle event. For example, a detected vehicle event may have a low level of relevance if it is duplicative of other vehicle events, as well as expected based on historical vehicle event information. For example, if a particular intersection has 10 fender-benders per month on average, then the 5th fender-bender occurring in the middle of the current month may be expected, duplicative, and have a relatively low level of relevance. However, if a particular intersection has 1 fender-benders per year on average, then the 5th fender-bender occurring in the middle of the current month may be unexpected, not duplicative in light of historical averages, and have a relatively high level of relevance. Additionally, this latter example may indicate a trend.

Relevance component 26 may be configured to compare the event-specific relevance metric to a relevance threshold. In some implementations, responsive to the event-specific relevance metric at least meeting the relevance threshold, relevance component 26 may be configured to add a new vehicle event scenario to either a set of new vehicle event scenarios that are not included in stored set 15 of vehicle event scenarios, or to stored set 15 of vehicle event scenarios. The new vehicle event scenario may be based on received information, e.g., received information regarding a detected vehicle event. In some implementations, the set of new vehicle event scenarios may represent circumstances and/or physical surroundings around particular vehicles, the vehicles being related to vehicle events.

Figure 3:
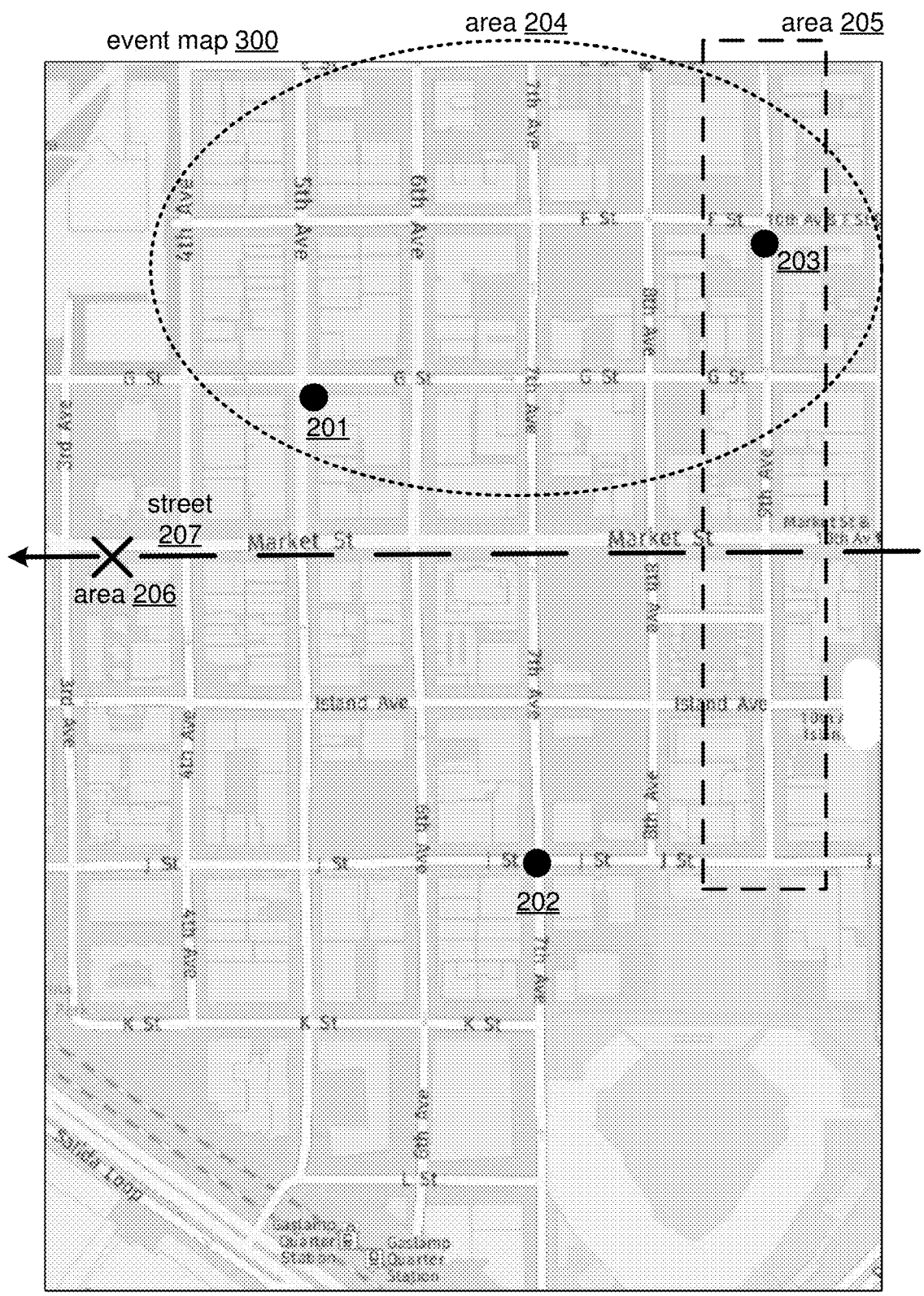
FIG. 3 illustrates an event map showing locations of detected vehicle events in relation to particular areas of interest to detected vehicle events, which depicts information that may be used to generate and provide timely vehicle event information, in accordance with one or more embodiments.

In some implementations, an event-specific relevance metric may be based at least in part on a geographical location that is associated with a detected vehicle event. In some implementations, an event-specific relevance metric may be determined based one or more comparisons with information included in one or more vehicle event scenarios, e.g., stored set 15 of vehicle event scenarios. By way of non-limiting example, FIG. 3 illustrates an event map 300 showing locations of detected vehicle events in relation to particular areas of interest for the detected vehicle events, which depicts information that may be used to generate and provide timely vehicle event information by a system similar to system 100. Event map 300 shows locations of detected vehicle events in a particular area, in particular first event 201, second event 202, third event 203 (similar to event map 200 in FIG. 2), and/or other information. As depicted in event map 300, an area 205 (shown as a dashed rectangle) may indicate part of a particular trucking route of interest to some third party. Accordingly, any vehicle event in or near area 205 may be highly relevant in this case. In particular, third event 203 is located within area 205, and may therefore be highly relevant.

Referring to FIG. 1, in some implementations, an event-specific relevance metric may increase in relevance responsive to the received information (for a particular detected vehicle event) being dissimilar to the information included in a set of vehicle event scenarios, such as stored set 15 of vehicle event scenarios. In some implementations, an event-specific relevance metric may decrease in relevance responsive to the received information (for a particular detected vehicle event) being similar to the information included in a set of vehicle event scenarios. In some implementations, an event-specific relevance metric may indicate a level of relevance by quantifying one or both of uniqueness and/or distinctiveness of the received information (for a particular detected vehicle event) compared to the information included in a set of vehicle event scenarios.

In some implementations, an event-specific relevance metric may be based at least in part on user-controlled criteria. For example, a user may provide user input that represents one or more of entry and/or selection of one or more user-controlled criteria.

Trend component 30 may be configured to determine whether a new vehicle event scenario, a set of new vehicle event scenarios, and/or a stored set of vehicle event scenarios are indicative of a trend in detected vehicle events. The determination may be based on a statistical analysis. For example, the determination may be based on a comparison between the geographical location of a detected vehicle event and the geographical locations of other vehicle events. Alternatively, and/or simultaneously, the date and/or time of day of a detected vehicle event may be compared with the dates and/or times of day of other vehicle events. Alternatively, and/or simultaneously, other parameters, characteristics, and/or vehicle-specific information of a detected vehicle event may be compared with similar information of other vehicle events.

A trend may correspond to an increase in a particular type of vehicle events compared to an expectation for the particular type of vehicle events. In some implementations, the expectation may be based on historical vehicle event information. In some implementations, the expectation may be based on analysis of a set of vehicle event scenarios. For example, the expectation may be based on mathematical probabilities. In some implementations, trend component 30 may be configured to determine mathematical probabilities of certain vehicle events or vehicle event scenarios (based on historical information and/or information extracted from a set of vehicle event scenarios), compare whether the likelihood and/or probability of certain vehicle events or vehicle event scenarios exceeds a trend-related threshold, and determine whether a trend is occurring based on that comparison.

By way of non-limiting example, FIG. 3 illustrates an area 204 (shown as a dotted oval shape) for which an expectation for vehicle events has been determined, e.g., based on a statistical analysis of historical information and/or information extracted from a set of vehicle event scenarios for area 204. Once first event 201 occurs, system 100 may determine that this occurrence falls within the determined expectation, and is therefore not indicative of a trend. Once second event 202 occurs, system 100 may determine that this occurrence falls outside of area 204, and may therefore not be indicative of any trends pertaining to area 204. However, once third event 203 occurs in the same area 204, system 100 may determine that this occurrence falls outside the determined expectation, and is therefore indicative of a trend. For example, a heavily used route through a street 207 may be temporarily closed, e.g., due to construction in area 206, and this may cause higher levels of traffic in other areas, such as area 204. As a result, more vehicle events may occur in area 204, and this may indicate a (temporary) trend. In some cases, trends may be temporary and last only 1 day, 1 week, 1 month, or more. In other cases, trends may span a longer period and build and/or grow over months or years.

Storage component 29 may be configured to store information in electronic storage. For example, the information may be stored in the electronic storage of a particular vehicle. In some implementations, the stored information may be related to detected vehicle events, determined vehicle parameters, executable code, and/or other information. For example, stored information may be associated with detected vehicle events, and include information regarding the physical surroundings in which the particular vehicle was operating at the time of the detected vehicle events. In some implementations, storage component 29 may be configured to store vehicle event records of detected vehicle events in electronic storage.

Report component 24 may be configured to generate reports associated with one or more of generated output signals, detected vehicle events, information regarding physical surroundings of vehicles, responses to queries, results from executable code, and/or other information. In some implementations, report component 24 may be configured to publish reports, e.g. by posting it online or through other mechanisms that effectuate publication. In some implementations, report component 24 may be configured to transfer reports to users, third parties, and/or other entities interested in one or more of the vehicles, their routes, or their contents/cargo. Reports may include information captured by image sensors during detected vehicle events. In some implementations, reports may include information that is derived from and/or based on information captured by image sensors during detected vehicle events.

Simulation component 31 may be configured to create a simulation (or simulation scenario) that mimics the physical surroundings of a particular vehicle at the time of a detected vehicle event involving the particular vehicle and/or a nearby vehicle. In some implementations, simulation component 31 may be configured to create a simulation scenario that is similar to the circumstances that lead to the detected vehicle event and/or that represents the physical surroundings around a particular vehicle at the time of a detected vehicle event. Such a simulation scenario may be used to train, test, or rate vehicle operators and/or autonomous driving algorithms.

In some implementations, one or more components of system 100 may be configured to obtain, receive, and/or determine contextual information related to environmental conditions near and/or around vehicles. Environmental conditions may be related to weather conditions, road surface conditions, traffic conditions, visibility (e.g., position of the sun, occurrence of fog, glare or reflections into the cabin of the vehicle, headlights of oncoming traffic, etc.), and/or other environmental conditions. In some implementations, environmental conditions may be related to proximity of certain objects that are relevant to driving, including but not limited to traffic signs, railroad crossings, time of day, ambient light conditions, altitude, and/or other objects relevant to driving. In some implementations, contextual information may include a likelihood of traffic congestion near a particular vehicle, and/or near a particular location. In some implementations, contextual information may include a likelihood of the road surface near a particular vehicle and/or a particular location being icy, wet, and/or otherwise potentially having an effect of braking. In some implementations, environmental conditions may include information related to a particular driver and/or a particular trip. For example, with every passing hour that a particular driver drives his vehicle during a particular trip, the likelihood of drowsiness may increase. In some implementations, the function between trip duration or distance and likelihood of drowsiness may be driver-specific.

In some implementations, one or more environmental conditions may be received from one or more sources external to the vehicle. For example, a source external to the vehicle may include one or more external providers 18. For example, contextual information related to weather conditions may be received from a particular external provider 18 that provides weather information. For example, contextual information related to road surface conditions may be received from a particular external provider 18 that provides road condition information. For example, contextual information related to traffic conditions may be received from a particular external provider 18 that provides traffic information.

In some implementations, detection of vehicle events may further be based one or more types of contextual information. In some implementations, detection may be accomplished and/or performed at the vehicle. In some implementations, a value of a current operating condition that effectuates detection of a vehicle event and/or determination of an event type may vary as a function of the contextual information. For example, a speed of 50 mph (in a particular geographical location) may not effectuate detection of a vehicle event and/or determination of an event type when the road surface is dry and/or when traffic is light, but the same speed in the same geographical location may effectuate detection of a vehicle event and/or determination of an event type responsive to contextual information and/or other information indicating that the road surface is wet and/or icy (and/or may be wet and/or icy), or responsive to contextual information (and/or other information) that traffic is heavy (and/or may be heavy). In this example, the contextual information (and/or other information) may have an effect of the detection of vehicle events and/or the determination of event types. In some implementations, contextual information (and/or other information) may modify the sensitivity of the process and/or mechanism by which vehicle events are detected and/or event types are determined. In some implementations, detection of vehicle events and/or determination of event types may be based on one or more comparisons of the values of current operating conditions with threshold values. In some implementations, a particular threshold value may vary as a function of contextual information. In some implementations, a particular threshold value may vary as a function of other information, e.g. as determined based on sensor output.

By way of non-limiting example, lateral forces of about −0.3 g (e.g., swerve left) and/or about +0.3 g (e.g., swerve right) may be a basis used to detect a swerve. In some implementations, the −0.3 g and/or +0.3 g criteria may be used at the vehicle speeds less than about 10 kph. The −0.3 g and/or +0.3 g criteria may be scaled as the vehicle increases in speed. In some implementations, the −0.3 g and/or +0.3 g criteria may be scaled (e.g., reduced) by about 0.0045 g per kph of speed over 10 kph. To prevent too much sensitivity, the lateral force criteria may be limited to about +/−0.12 g, regardless of the speed of the vehicle, for example. In some implementations, the criterion for the given period of time between swerves may be about 3 seconds.

Electronic storage 119 may comprise electronic storage media that electronically stores information. The electronic storage media of electronic storage 119 may comprise one or both of system storage that is provided integrally (i.e., substantially non-removable) with system 100 and/or removable storage that is removably connectable to system 100 via, for example, a port (e.g., a USB port, a firewire port, etc.) or a drive (e.g., a disk drive, etc.). Electronic storage 119 may comprise one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 119 may store software algorithms, recorded video event data, information determined by processor 104, information received via a user interface, and/or other information that enables system 100 to function properly. Electronic storage 119 may be (in whole or in part) a separate component within system 100, or electronic storage 119 may be provided (in whole or in part) integrally with one or more other components of system 100.

As described above, processor 104 may be configured to provide information-processing capabilities in system 100. As such, processor 104 may comprise one or more of a digital processor, an analog processor, a microprocessor, a computer processor, a digital circuit designed to process information, an analog circuit designed to process information, a state machine, and/or other mechanisms for electronically processing information. Although processor 104 is shown in FIG. 1 as a single entity, this is for illustrative purposes only. In some implementations, processor 104 may comprise a plurality of processing units. These processing units may be physically located within the same device (e.g., a vehicle event recorder), or processor 104 may represent processing functionality of a plurality of devices operating in coordination.

Processor 110 may be configured to execute components 21-31 by software; hardware; firmware; some combination of software, hardware, and/or firmware; and/or other mechanisms for configuring processing capabilities on processor 110. It should be appreciated that although components 21-31 are illustrated in FIG. 1 as being co-located within a single processing unit, in implementations in which processor 104 comprises multiple processing units, one or more of components 21-31 may be located remotely from the other components. The description of the functionality provided by the different components 21-31 described herein is for illustrative purposes, and is not intended to be limiting, as any of components 21-31 may provide more or less functionality than is described. For example, one or more of components 21-31 may be eliminated, and some or all of its functionality may be provided by other components 21-31. As another example, processor 104 may be configured to execute one or more additional components that may perform some or all of the functionality attributed below to one of components 21-31.

Figure 4:
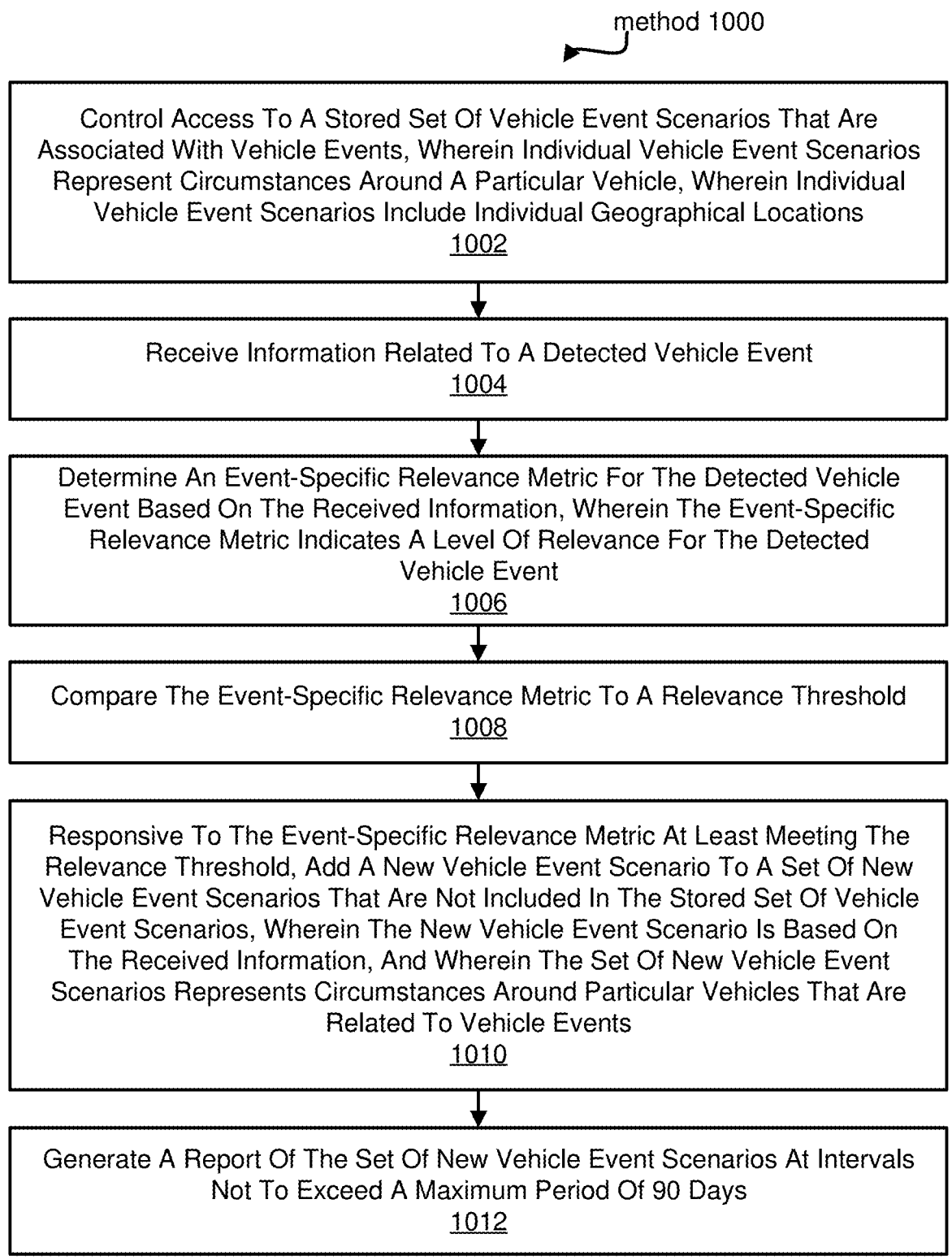
FIG. 4-5 illustrate methods to generate and provide timely vehicle event information for a fleet of vehicles, in accordance with one or more embodiments.
Figure 5:
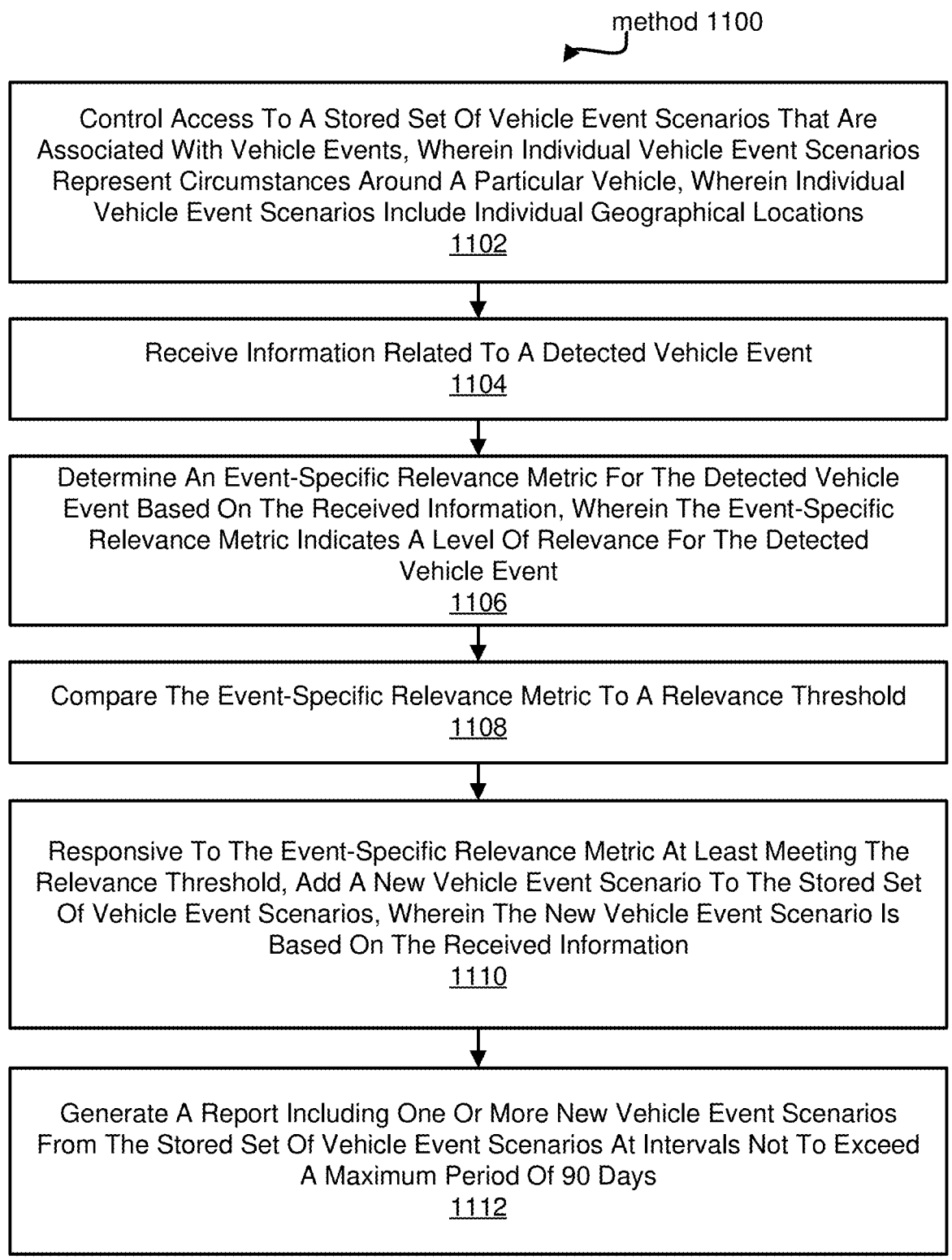

FIGS. 4-5 illustrate a method 1000 and a method 1100 to generate data describing physical surroundings of vehicles during operation. The operations of methods 1000-1100 presented below are intended to be illustrative. In some implementations, methods 1000-1100 may be accomplished with one or more additional operations not described, and/or without one or more of the operations discussed. Additionally, the order in which the operations of methods 1000-1100 are illustrated and described below is not intended to be limiting. In some implementations, two or more of the operations may occur substantially simultaneously.

In some implementations, methods 1000-1100 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of methods 1000-1100 in response to instructions stored electronically on one or more electronic storage mediums. The one or more processing devices may include one or more devices configured through hardware, firmware, and/or software to be specifically designed for execution of one or more of the operations of methods 1000-1100.

Referring to FIG. 4 and method 1000, at an operation 1002, access to a stored set of vehicle event scenarios is controlled, wherein the vehicle event scenarios are associated with vehicle events. Individual vehicle event scenarios represent circumstances around a particular vehicle for at least a first predefined period prior to occurrences of potential vehicle events. Individual vehicle event scenarios include individual geographical locations. In some embodiments, operation 1002 is performed by a scenario component the same as or similar to scenario component 25 (shown in FIG. 1 and described herein).

At an operation 1004, information is received related to a detected vehicle event. In some embodiments, operation 1004 is performed by a distribution component the same as or similar to distribution component 23 (shown in FIG. 1 and described herein).

At an operation 1006, an event-specific relevance metric is determined for the detected vehicle event based on the received information. The event-specific relevance metric indicates a level of relevance for the detected vehicle event. In some embodiments, operation 1006 is performed by a relevance component the same as or similar to relevance component 26 (shown in FIG. 1 and described herein).

At an operation 1008, the event-specific relevance metric is compared to a relevance threshold. In some embodiments, operation 1008 is performed by a relevance component the same as or similar to relevance component 26 (shown in FIG. 1 and described herein).

At an operation 1010, responsive to the event-specific relevance metric at least meeting the relevance threshold, a new vehicle event scenario is added to a set of new vehicle event scenarios that are not included in the stored set of vehicle event scenarios. The new vehicle event scenario is based on the received information. The set of new vehicle event scenarios represents circumstances around particular vehicles that are related to vehicle events. In some embodiments, operation 1010 is performed by a scenario component the same as or similar to scenario component 25 (shown in FIG. 1 and described herein).

At an operation 1012, a report is generated of the set of new vehicle event scenarios at intervals not to exceed a maximum period of 90 days. In some embodiments, operation 1012 is performed by a report component the same as or similar to report component 24 (shown in FIG. 1 and described herein).

Referring to FIG. 5 and method 1100, at an operation 1102, access to a stored set of vehicle event scenarios is controlled, wherein the vehicle event scenarios are associated with vehicle events. Individual vehicle event scenarios represent circumstances around a particular vehicle for at least a first predefined period prior to occurrences of potential vehicle events. Individual vehicle event scenarios include individual geographical locations. In some embodiments, operation 1102 is performed by a scenario component the same as or similar to scenario component 25 (shown in FIG. 1 and described herein).

At an operation 1104, information is received related to a detected vehicle event. In some embodiments, operation 1104 is performed by a distribution component the same as or similar to distribution component 23 (shown in FIG. 1 and described herein).

At an operation 1106, an event-specific relevance metric is determined for the detected vehicle event based on the received information. The event-specific relevance metric indicates a level of relevance for the detected vehicle event. In some embodiments, operation 1106 is performed by a relevance component the same as or similar to relevance component 26 (shown in FIG. 1 and described herein).

At an operation 1108, the event-specific relevance metric is compared to a relevance threshold. In some embodiments, operation 1108 is performed by a relevance component the same as or similar to relevance component 26 (shown in FIG. 1 and described herein).

At an operation 1110, responsive to the event-specific relevance metric at least meeting the relevance threshold, a new vehicle event scenario is added to the stored set of vehicle event scenarios. The new vehicle event scenario is based on the received information. In some embodiments, operation 1110 is performed by a scenario component the same as or similar to scenario component 25 (shown in FIG. 1 and described herein).

At an operation 1112, a report is generated including one or more new vehicle event scenarios from the set of stored vehicle event scenarios at intervals not to exceed a maximum period of 90 days. For example, vehicle event scenarios may be associated with a date (e.g., a date of creation or a date of being added to a set), which may subsequently be used when the report is generated. In some embodiments, operation 1112 is performed by a report component the same as or similar to report component 24 (shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system configured to generate vehicle event information, the system configured to couple with a fleet of vehicles including a first vehicle, the system comprising:
 a remote computing server including one or ore processors configured via machine-readable instructions to:
  control access to a stored set of vehicle event scenarios that are associated with vehicle events, wherein individual vehicle event scenarios represent circumstances around a particular vehicle for at least a first predefined period prior to occurrences of potential vehicle events, wherein the potential vehicle events have particular event types, and wherein individual vehicle event scenarios include individual geographical locations;
  receive, from the first vehicle, information related to a detected vehicle event, wherein the detected vehicle event is associated with a particular geographical location, and wherein the detected vehicle event has a particular event type;
  compare the particular event type and the particular geographical location of the detected event with corresponding information for the stored set of vehicle event scenarios; and
  based on the comparison, determine whether to add a new vehicle event scenario to a set of new vehicle event scenarios that are not included in the stored set of vehicle event scenarios, wherein the new vehicle event scenario is based on the received information, and wherein the set of new vehicle event scenarios represents circumstances around particular vehicles that are related to vehicle events.

2. The system of claim 1, wherein the one or more processors are further configured to generate a report of the set of new vehicle event scenarios at intervals not to exceed a maximum period of 90 days.

3. The system of claim 2, wherein the one or more processors are further configured via machine-readable instructions to:
 publish the report and/or transfer the report to a third party.

4. The system of claim 1, wherein the comparison produces a metric that indicates a level of relevance by quantifying one or both of uniqueness and/or distinctiveness of the received information compared to the information included in the stored set of vehicle event scenarios.

5. The system of claim 1, wherein the one or more processors are further configured via machine-readable instructions to:
 receive user input through a user interface from a user, wherein the user input represents one or more of entry and/or selection of one or more user-controlled criteria that are controlled by the user,
 wherein the comparison is based on the one or more user-controlled criteria.

6. The system of claim 1, further comprising:
 a set of resources carried by the first vehicle, wherein the set of resources includes a transceiver and one or more sensors, wherein the one or more sensors are configured to generate output signals conveying information related to one or both of circumstances around the first vehicle and/or operating conditions of the first vehicle, wherein the set of resources is configured to detect vehicle events, including the detected vehicle event, based on the generated output signals, wherein the transceiver is configured to transfer and receive information to and from the remote computing server, and wherein the transferred information includes vehicle-specific information related to the detected vehicle event.

7. The system of claim 1, wherein the one or more processors are further configured via machine-readable instructions to:
determine whether the new vehicle event scenario, the set of new vehicle event scenarios, and/or the stored set of vehicle event scenarios are indicative of a trend in detected vehicle events, wherein the determination is based on a statistical analysis, wherein the trend corresponds to an increase in a particular type of vehicle events compared to an expectation for the particular type of vehicle events, wherein the expectation is based on historical vehicle event information.

8. The system of claim 1, wherein the one or more processors are further configured via machine-readable instructions to:
create a simulation that mimics the circumstances around the first vehicle at the time of the detected vehicle event.

9. A method for generating vehicle event information, the method being implemented in a system including a remote computing server, the system being coupled to a fleet of vehicles including a first vehicle, the method comprising:
controlling, by the remote computing server, access to a stored set of vehicle event scenarios that are associated with vehicle events, wherein individual vehicle event scenarios represent circumstances around a particular vehicle for at least a first predefined period prior to occurrences of potential vehicle events, wherein the potential vehicle events have particular event types, and wherein individual vehicle event scenarios include individual geographical locations;
receiving, from the first vehicle, information related to a detected vehicle event, wherein the detected vehicle event is associated with a particular geographical location, and wherein the detected vehicle event has a particular event type;
comparing the particular event type and the particular geographical location of the detected event with corresponding information for the stored set of vehicle event scenarios; and
based on the comparison, determining whether to add a new vehicle event scenario to a set of new vehicle event scenarios that are not included in the stored set of vehicle event scenarios, wherein the new vehicle event scenario is based on the received information, and wherein the set of new vehicle event scenarios represents circumstances around particular vehicles that are related to vehicle events.

10. The method of claim 9, further comprising generating a report of the set of new vehicle event scenarios at intervals not to exceed a maximum period of 90 days.

11. The method of claim 9, wherein the comparison produces a metric that indicates a level of relevance by quantifying one or both of uniqueness and/or distinctiveness of the received information compared to the information included in the stored set of vehicle event scenarios.

12. The method of claim 9, further comprising:
receiving user input through a user interface from a user, wherein the user input represents one or more of entry and/or selection of one or more user-controlled criteria that are controlled by the user,
wherein the comparison is based on the one or more user-controlled criteria.

13. The method of claim 9, further comprising:
generating output signals conveying information related to one or both of circumstances around the first vehicle and/or operating conditions of the first vehicle;
detecting vehicle events, including the detected vehicle event, based on the generated output signals;
transferring information from the first vehicle to the remote computing server, wherein the transferred information includes vehicle-specific information related to the detected vehicle event; and
receiving, by the remote computing server, the transferred information.

14. The method of claim 9, further comprising:
determining whether the new vehicle event scenario, the set of new vehicle event scenarios, and/or the stored set of vehicle event scenarios are indicative of a trend in detected vehicle events, wherein this determining is based on a statistical analysis, wherein the trend corresponds to an increase in a particular type of vehicle events compared to an expectation for the particular type of vehicle events, wherein the expectation is based on historical vehicle event information.

15. The method of claim 9, further comprising:
creating a simulation that mimics the circumstances around the first vehicle at the time of the detected vehicle event.

\* \* \* \* \*